(12) United States Patent
Song (10) Patent No.: US 11,094,591 B2
(45) Date of Patent: Aug. 17, 2021

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Chun Song, Shanghai (CN)

(73) Assignees: Semiconductor Manufacturing International (Shanghai) Corporation, Shanghai (CN); Semiconductor Manufacturing International (Beijing) Corporation ], Beijing (CN)

(*) Notice: Subject to any disclaimer, the term of this patent is extended or adjusted under 35 U.S.C. 154(b) by 120 days.

(21) Appl. No.: 16/045,329

(22) Filed: Jul. 25, 2018

(65) Prior Publication Data

US 2019/0035683 A1 Jan. 31, 2019

(30) Foreign Application Priority Data

Jul. 26, 2017 (CN) .......................... 201710616952.X (51) Int. Cl.
*H01L 21/78* (2006.01)
*H01L 27/02* (2006.01)
(Continued)

(52) U.S. Cl.
CPC ............ *H01L 21/78* (2013.01); *H01L 21/762* (2013.01); *H01L 21/76224* (2013.01);
(Continued)

(58) Field of Classification Search
CPC ....... H01L 21/762; H01L 21/78; H01L 23/00; H01L 23/544; H01L 27/02; H01L 27/118;
(Continued)

(56) References Cited

U.S. PATENT DOCUMENTS 9,679,855 B1\* 6/2017 Lee ..................... H01L 23/544
2005/0269702 A1\* 12/2005 Otsuka ............. H01L 21/76801
257/750

(Continued)

FOREIGN PATENT DOCUMENTS

CN 1734764 A 2/2006
CN 101770992 A 7/2010

*Primary Examiner* — Matthew C Landau
*Assistant Examiner* — Dmitriy Yemelyanov
(74) *Attorney, Agent, or Firm* — Anova Law Group, PLLC (57) ABSTRACT

Semiconductor structures and fabrication methods are provided. An exemplary semiconductor structure includes a semiconductor substrate having a plurality of cell regions. Each of the cell regions includes a device region, a protection region surrounding the device region and an isolation region surrounding the device region and the protection region. The semiconductor structure also includes a device structure on the semiconductor substrate in the device region; a protection ring structure on the semiconductor substrate in the protection region; an isolation structure on the semiconductor substrate in the isolation region; a passivation layer on the protection ring structure, the device structure and the isolation structure; and a trench passing through the passivation layer in the isolation region.

18 Claims, 4 Drawing Sheets

(51) Int. Cl.
   *H01L 27/118*   (2006.01)
   *H01L 21/762*   (2006.01)
   *H01L 23/00*    (2006.01)
   *H01L 29/78*    (2006.01)
   *H01L 29/06*    (2006.01)
   *H01L 23/544*   (2006.01)
   *H01L 23/58*    (2006.01)

(52) U.S. Cl.
   CPC .......... *H01L 23/544* (2013.01); *H01L 23/562* (2013.01); *H01L 23/585* (2013.01); *H01L 27/0203* (2013.01); *H01L 27/11803* (2013.01); *H01L 29/0623* (2013.01); *H01L 29/0649* (2013.01); *H01L 29/7846* (2013.01)

(58) Field of Classification Search
   CPC ... H01L 29/06; H01L 29/07; H01L 21/76224; H01L 23/562; H01L 23/585; H01L 27/0203; H01L 27/11803; H01L 29/0623; H01L 29/0649; H01L 29/7846
   See application file for complete search history.

(56) References Cited

U.S. PATENT DOCUMENTS

2007/0001307 A1* 1/2007 Usui ................. H01L 23/291
                                                    257/758
2009/0321890 A1* 12/2009 Jeng ................. H01L 23/562
                                                    257/620

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710616952.X, filed on Jul. 26, 2017, the entirety of which is incorporated herein by reference.

FIELD OF THE DISCLOSURE

The present disclosure generally relates to the field of semiconductor manufacturing technologies and, more particularly, relates to semiconductor structures and fabrication methods.

BACKGROUND

With the repaid development of semiconductor technologies, the size of the integrated circuit (IC) has been continuously reduced. Correspondingly, the performances of devices have been continuously improved.

A semiconductor structure is often formed by providing a wafer (substrate) having a plurality of functional regions and cutting paths between adjacent functional regions; forming chips having device structures in the functional regions; and dicing the wafer along the cutting path to separate the chips; and packaging the chips.

To reduce the effect of the dicing force to the device structures, protection rings are often formed in the functional regions between the cutting path and the device structure. The protection ring includes a protective dielectric layer and a metal layer in the protective dielectric layer.

However, conventional methods for forming the semiconductor structure may affect performance of the protection structures. The disclosed methods and semiconductor structures are directed to solve one or more problems set forth above and other problems in the art.

BRIEF SUMMARY OF THE DISCLOSURE

One aspect of the present disclosure includes a semiconductor structure. The semiconductor structure includes a semiconductor substrate having a plurality of cell regions. Each cell region includes a device region, a protection region surrounding the device region and an isolation region surrounding the device region and the protection region. The semiconductor structure may also include a device structure on the semiconductor substrate in the device region; a protection ring structure on the semiconductor substrate in the protection region; an isolation structure on the semiconductor substrate in the isolation region; a passivation layer on the protection ring structure, the device structure and the isolation structure; and a trench passing through the passivation layer in the isolation region.

Another aspect of the present disclosure includes a method for fabricating a semiconductor structure. The method includes providing a semiconductor substrate having a plurality of cell regions. Each cell region may include a device region, a protection region surrounding the device region and an isolation region surrounding the device region and the protection region; forming a device structure on the semiconductor substrate in the device region; forming a protection ring structure on the semiconductor substrate in the protection region; forming an isolation structure on the semiconductor substrate in the isolation region; forming a passivation layer on the protection ring structure, the device structure and the isolation structure; and forming a trench passing through the passivation layer in the isolation region.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
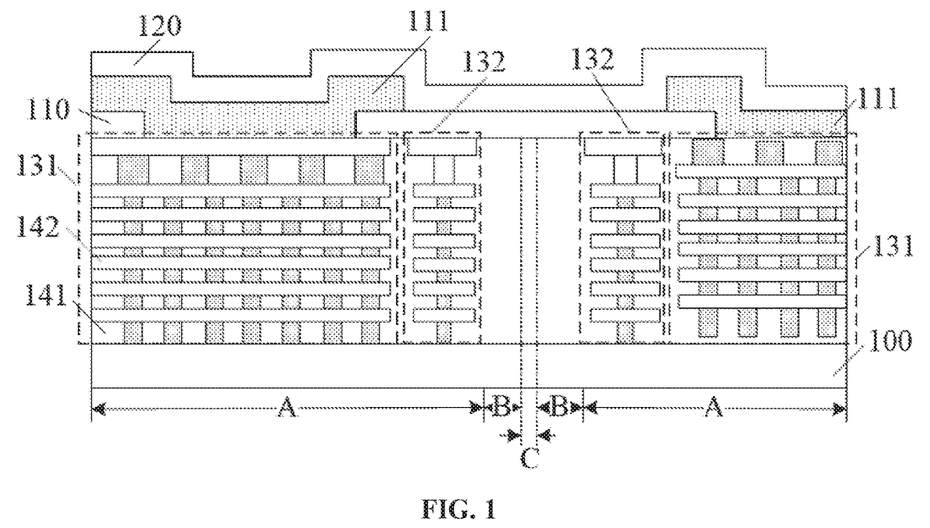
FIG. 1 illustrates a semiconductor structure.

FIG. 1 illustrates a semiconductor structure. As shown in FIG. 1, the semiconductor structure may include a semiconductor substrate 100 having a plurality of cell regions "A" and cutting path regions "C" between adjacent cell regions. Each of the cell regions includes a device region (not shown) and a protection region "A" around the device region; and an isolation region "B" around the device and the protection region "A".

Further, the method includes forming a protection ring structure on the semiconductor substrate 100 in the protection region "A". The protection ring structure includes a first protection ring 131 and a second protection ring 132 between the first protection ring 131 and the isolation region "B". Further, the method includes forming a dielectric layer on the isolation regions "B" and the cutting path regions "C"; and forming a first passivation layer 110 on the second protection ring 132 and the first protection ring 131. A top metal layer 111 is formed in the first passivation layer 110 on the first protection ring 131. Further, the method includes forming a second passivation layer 120 on the first passivation layer 110 and on the top metal layer 111; and dicing the dielectric layer and the semiconductor substrate 100 along the cutting path regions "C" to obtain the semiconductor structures.

Each of the first protection ring 131 and the second protection ring 132 includes a protective dielectric layer 141 and a metal layer 142 in the protective layer 141; and the protective dielectric layer 141 exposes the surface of the metal layer 142. The first passivation layer 110 and the second passivation layer 120 are used to isolate the protection ring structure from the external environment. The first passivation layer 110 and the second passivation layer 120 are made of silicon oxide or silico nitride. Silicon oxide and silicon nitride have acceptable thermal isolation properties. However, because the mechanical strength of the first passivation layer 110 and the second passivation layer 120 are relatively small, when dicing the dielectric layer and the semiconductor substrate 100, the semiconductor structure receives a certain external force, the first passivation layer 110 and the second passivation layer 120 of the second protection ring 132 are easily affected by the dicing force. Thus, the first passivation layer 110 and the second passivation layer 120 on the second protection ring 132 are easy to crack. Accordingly, the metal layer 142 of the second protection 132 is exposed; and the metal layer 142 is easily eroded by air; and the performance of the semiconductor structure is adversely affected.

The present disclosure provides a semiconductor structure and a fabrication method. The semiconductor structure includes a semiconductor substrate having a plurality of cell regions. Each cell region may include at least a device region, a protection region and an isolation region. The semiconductor structure may also include a protection ring structure on the semiconductor structure in the protection region; an isolation structure on the semiconductor substrate in the isolation region; and a passivation layer on the protection ring structure and the isolation structure. The passivation layer in the isolation region may have a trench. The trench may be able to reduce the effect of the external force to the passivation layer in the protection region; and reduce the damage to the passivation layer in the protection region. Thus, the erosion of the external air to the protection ring structure may be reduced; and the performance of the semiconductor structure may be improved.

Figure 7:
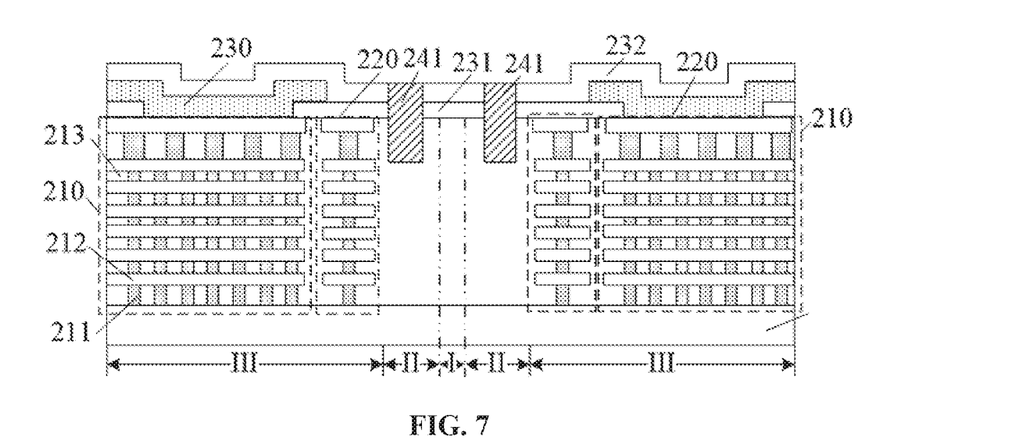
Figure 8:
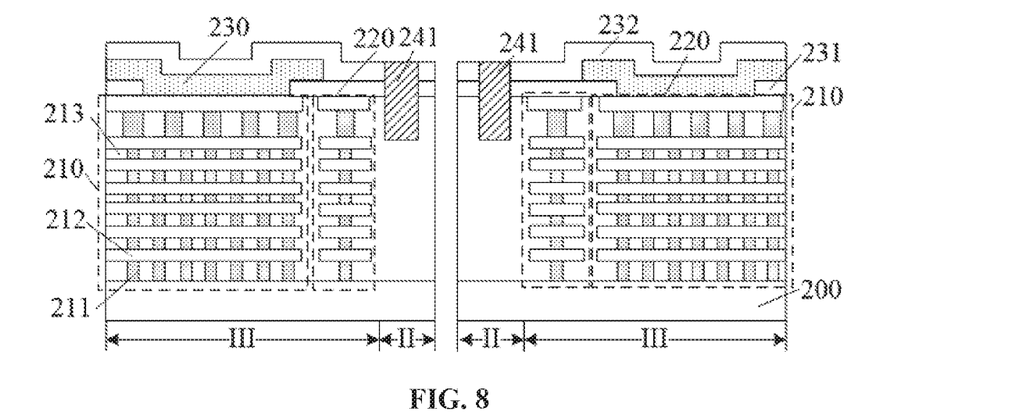
Figure 9:
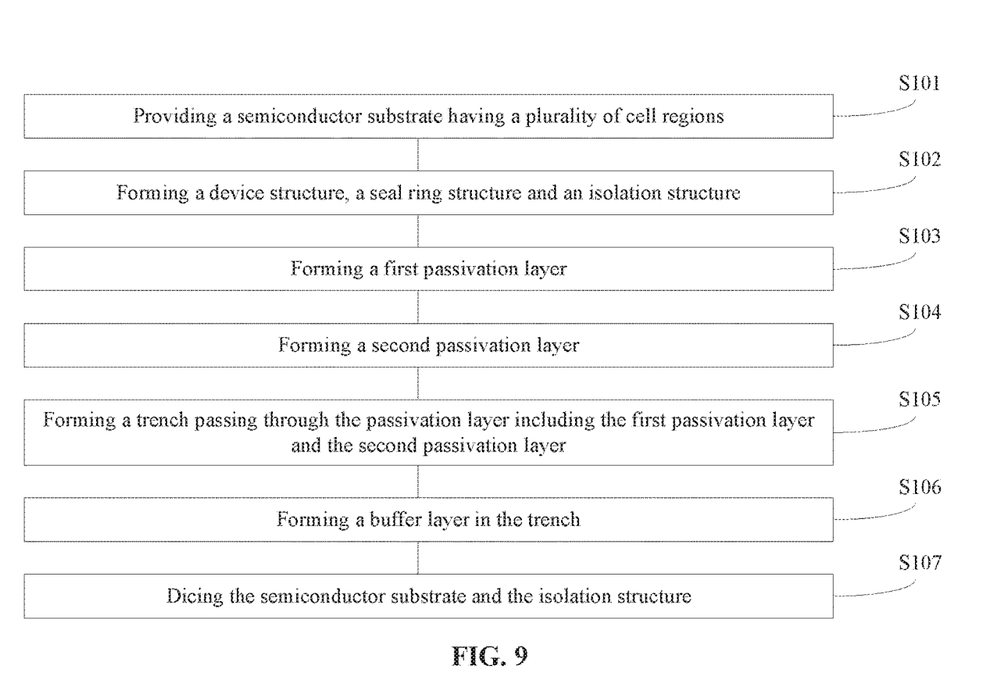
FIG. 9 illustrates an exemplary fabrication process of a semiconductor structure consistent with various disclosed embodiments.

FIG. 9 illustrates an exemplary fabrication process of a semiconductor structure consistent with various disclosed embodiments. FIGS. 2-8 illustrate structures corresponding to certain stages during the exemplary fabrication process.

Figure 2:
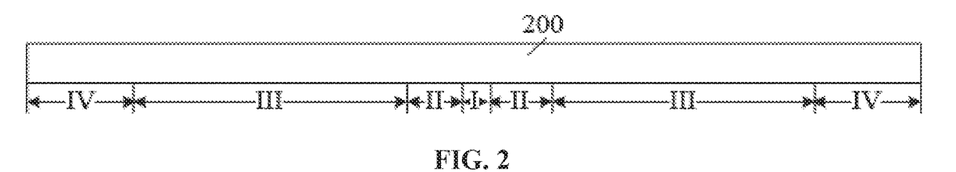
FIGS. 2-8 illustrate structures corresponding to certain stages during an exemplary fabrication process of a semiconductor structure consistent with various disclosed embodiments.

As shown in FIG. 9, at the beginning of the fabrication process, a semiconductor substrate is provided (S101). FIG. 2 illustrates a corresponding semiconductor structure.

As shown in FIG. 2, a semiconductor substrate 200 is provided. The semiconductor substrate 200 may include a plurality of cell regions. Each of the cell regions may include a device region IV, a protection region III, and an isolation region II. The protection region III may surround the device region; and the isolation region II may surround the protection region III and the device region IV.

The device region IV may be used to form device structure(s). The protection region III may be used to form a protection ring structure to protect the device structure(s).

In one embodiment, the semiconductor substrate 200 includes a plurality of cell regions. The protection region III may surround the device region IV; and the isolation region II may surround the device region IV and the protective region III. The isolation region II may be used to protect the protection ring structure in the protection region III.

Further, as shown in FIG. 2, in one embodiment, a cutting path region I is between adjacent cell regions. The cutting path region I may be used for subsequently dicing the semiconductor substrate 200 to form individual chips.

In one embodiment, from a top-down view (not shown) of the semiconductor structure illustrated in FIG. 2, the protection region III may be ring-shaped. The device region IV may be surrounded or enclosed by the protection region III.

In one embodiment, the semiconductor substrate 200 is a planar substrate. In some embodiments, the semiconductor substrate may include a base substrate and one or more fins on the base substrate.

In one embodiment, the semiconductor substrate 200 is a silicon substrate. In some embodiments, the semiconductor substrate may be a germanium substrate, a silicon germanium substrate, a silicon on insulator (SOI) substrate, or a germanium on insulator (GOI) substrate, etc.

Figure 3:
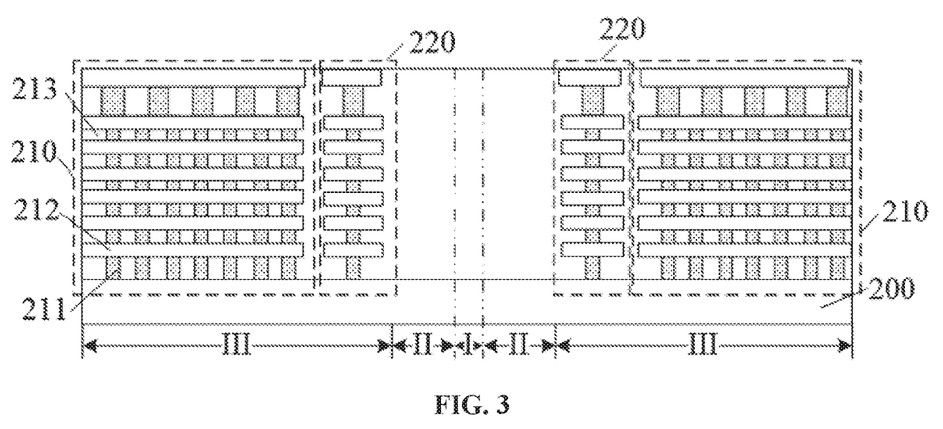

Returning to FIG. 9, after providing the semiconductor substrate, a device structure, a protection ring structure, and an isolation structure may be formed (S102). FIG. 3 illustrates a corresponding semiconductor structure.

As shown in FIG. 3, a device structure (not shown) may be formed on the semiconductor substrate 200 in the device region IV (e.g., as shown in FIG. 2). A protection ring structure may be formed on the semiconductor structure in the protection region III. An isolation structure may be formed on the semiconductor substrate 200 in the isolation region II.

In one embodiment, the device structure may include one or more semiconductor devices (not shown) in the device region IV (referring to FIG. 2) of the semiconductor substrate 200 and electrical interconnect structures (not shown) connecting the semiconductor devices. Any suitable semiconductor devices may be formed in the device region as desired and may be encompassed within the scope of the present disclosure.

The electrical interconnect structures may electrically connect with the semiconductor devices to form electrical connections with an external chip(s). The protection ring structures may be used to prevent the external environment from interfering the performances of the semiconductor devices.

In one embodiment, the device structure is an MOS transistor. The MOS transistor may include a gate structure on the semiconductor substrate 200 in the device region; and doped source/drain regions in the semiconductor substrate 200 at both sides of the gate structure. In some embodiments, the device structure may be a diode, a transistor, or a resistor, etc.

The electrical interconnect structure may include one or more of connection members. Each of the connection members may include a device dielectric layer on the semiconductor substrate 200 in the device region; device plugs in the device dielectric layer and a device metal layer on the device plugs.

In one embodiment, a protection ring structure may include one or more of protection members. Each of the protection members may include a protection dielectric layer on the semiconductor substrate 200 in the protection region III; a plurality of protection plugs 211 in the protection dielectric layer; and a protection metal layer 212 on the protection plugs 211. The protection members may be stacked together to form the protection ring structure.

A cutting path structure (not shown) may be formed on the semiconductor substrate 200 in the cutting path region I. The cutting path structure may include a plurality of cutting path members. Each of the cutting path members may include a cutting path dielectric layer on the semiconductor substrate 200; and cutting path plugs in the cutting path dielectric layer and a cutting path metal layer. The cutting path metal layer may be on the cutting path plugs.

In one embodiment, the process for forming the connection members, the protection members, the cutting path members and the isolation structures may include forming a dielectric layer 213 on the semiconductor substrate 200 in the device regions, the protection regions III, the isolation regions II and the cutting path regions I. The portions of the dielectric layer 213 in the device regions may be configured as the device dielectric layer. The portions of the dielectric layer 213 in the protection regions III may be configured as the protection dielectric layer. The portions of the dielectric layer 213 in the isolation regions II may be configured as an isolation structure. The portions of the dielectric layer 213 in the cutting path regions I may be configured as the cutting path dielectric layer. Then, plug holes and connection holes may be formed in the dielectric layer 213 in the device regions, the protection regions III and the cutting path regions I. The plug holes and the connection holes may pass through the dielectric layer 213. Then, plugs 211 may be formed in the plug holes. The plugs in the device regions may be configured as the device plugs. The plugs 211 in the protection regions III may be configured as the protection plugs. The plugs 211 in the cutting path regions may be configured as the cutting path plugs. Then, a metal layer 212 may be formed in the connection holes. The portion of the metal layer 212 in the device regions may be configured as the device metal layer. The portion of the metal layer 212 in the protection regions III may be configured as the protection metal layer. The portion of the metal layer 212 in the cutting path regions I may be configured as the cutting path metal layer.

The metal layer 212 may be made of any appropriate material. In one embodiment, the metal layer 212 is made of copper (Cu). Cu may have a sufficient mechanical strength; and may be able to protect the device structure. In some embodiments, the metal layer may be made of aluminum (Al), etc.

The dielectric layer 213 may be made of any appropriate material, such as silicon oxide, silicon nitride, or silicon oxynitride, etc.

In one embodiment, forming the plugs 211 in the plug holes and the metal layer 212 in the connection holes may include forming an initial metal layer in the plug holes and the connection holes; and planarizing the initial metal layer to remove the portion of the initial metal layer above the dielectric layer 213.

Various processes may be used to planarize the initial metal layer. In one embodiment, a chemical mechanical polishing (CMP) process is used to planarize the metal layer.

In one embodiment, as shown in FIG. 3, each of the protection ring structures may include a first protection ring 210 and a second protection ring 220. The first protection ring 210 may also be referred to as an inner protection ring; and the second protection ring 220 may also be referred to as an outer protection ring. The second protection ring 220 may be between the first protection ring 210 and the isolation region II. The metal layer 212 in the first protection ring 210 may not be connected to the metal layer 212 in the second protection ring 220.

Figure 4:
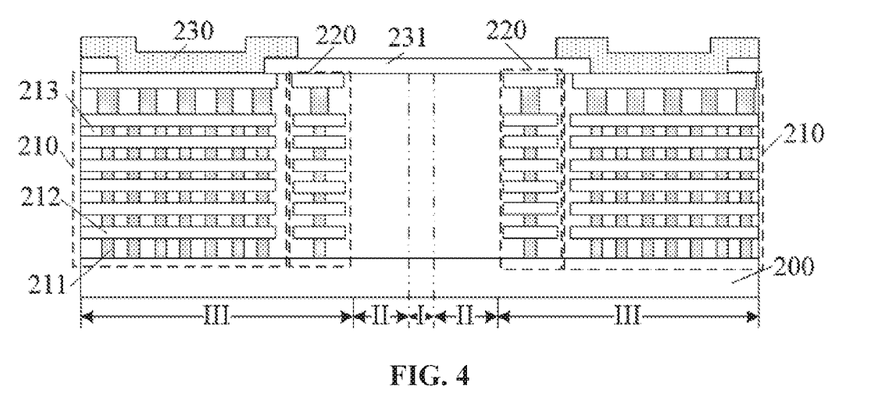

Returning to FIG. 9, after forming the device structures, the protection ring structures, and the isolation structures, a first passivation layer may be formed (S103). FIG. 4 illustrates a corresponding semiconductor structure.

As shown in FIG. 4, a first passivation layer 231 may be formed on the first protection ring 210, the second protection ring 220, the isolation structures, and the cutting path structures. A top metal layer 230 may be formed in the portion of the first passivation layer 231 on the first protection ring 210.

The first passivation layer 231 may be used to isolate the first protection ring 210, the second protection ring 220, the isolation structure, and the cutting path structure from the external circuits. The top metal layer 230 may be used to prevent the portion of the first passivation layer 231 on the first protection ring 210 from cracking.

The first passivation layer 231 may be made of any appropriate material, such as silicon nitride, silicon oxide, or silicon oxynitride, etc.

The top metal layer 230 may be made of any appropriate material. In one embodiment, the top metal layer 230 is made of aluminum (Al). Al may not be easily eroded by air.

In one embodiment, the process for forming the first passivation layer 231 and the top metal layer 230 may include forming a first initial passivation layer on the first protection ring 210, the second protection ring 220, the isolation structure and the cutting path structure; etching the first initial passivation layer to form a top layer hole to expose the first protection ring 210; forming an initial top metal layer in the top layer hole and on the first initial passivation layer; and patterning the initial top metal layer to form the top metal layer 230.

The initial top metal layer may be patterned by any appropriate process, such as a dry etching process, or a wet etching process, etc.

Figure 5:
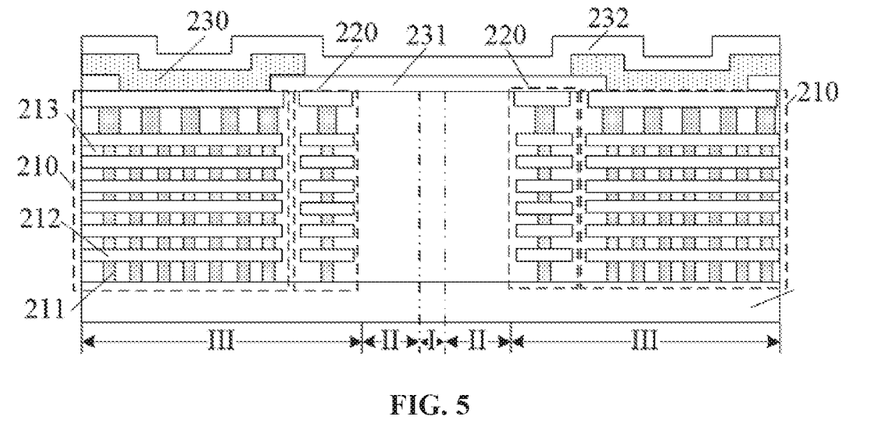

Returning to FIG. 9, after forming the first passivation layer, a second passivation layer may be formed (S104). FIG. 5 illustrates a corresponding semiconductor structure.

As shown in FIG. 5, a second passivation layer 232 is formed on the top metal layer 230 and the first passivation layer 231. The second passivation layer 232 may be used to isolate the top metal layer 230, the protection ring structure, the isolation structure and the device structure from the external environment.

The second passivation layer 232 may be made of any appropriate material, such as silicon nitride, silicon oxide, or silicon oxynitride, etc.

Various processes may be used to form the second passivation layer 232, such as a chemical vapor deposition (CVD) process, a physical vapor deposition (PVD) process, or an atomic layer deposition (ALD) process, etc.

The first passivation 231 and the second passivation layer 232 together may be referred to as a passivation layer. That is, the passivation layer may be formed on the protection ring structure, the device structure and the isolation structure.

Figure 6:
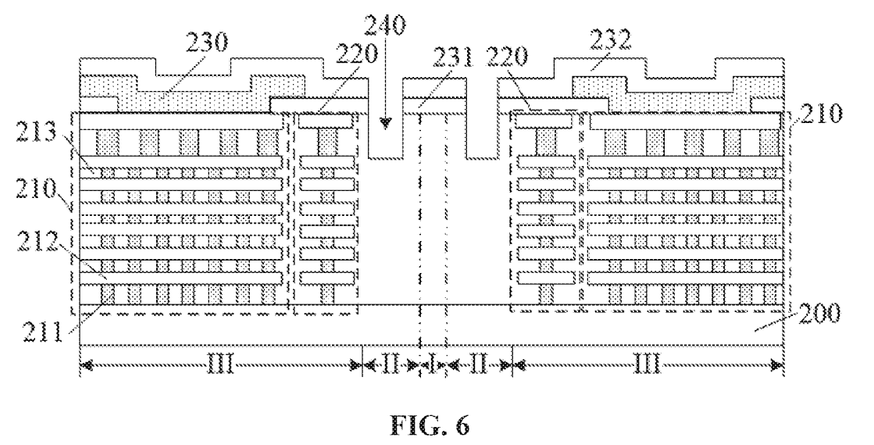

Returning to FIG. 9, after forming the passivation layer, trenches may be formed in the passivation layer (S105). FIG. 6 illustrates a corresponding semiconductor structure.

As shown in FIG. 6, a trench 240 is formed in the passivation layer in each of the isolation regions II.

When the passivation layer in the isolation region II is impacted by an external force, a stress may be easily generated in the passivation layer in the isolation region II. Because the trench 240 may be formed in the passivation layer in the isolation region II, the trench 240 may be able to isolate the stress. Accordingly, the effect of the external force to the passivation layer in the protection region III may be reduced; and the damage to the passivation layer in the protection region III may be prevented. Thus, the trench 240 may be able to prevent the passivation layer from exposing the protection ring structure; and the erosion of the external environment to the protection ring structure may be reduced. Accordingly, the performance of the semiconductor structure may be enhanced.

In one embodiment, the trench 240 may also be formed in the isolation structure in the isolation region II. That is, the trench 240 may pass through the passivation layer; and may extend into the isolation structure.

In one embodiment, the trench 240 may be formed by etching the passivation layer in the isolation region II and the isolation structure. The etching process may be a dry etching process, or a wet etching process, etc.

The ratio between the total thickness of the isolation structure and the passivation layer and the depth of the trench 240 may be any appropriate value. If the ratio between the total thickness of the isolation structure and the passivation layer and the depth of the trench 240 is too large, it may be not easy for the trench 240 to reduce the effect of the external force to the passivation layer in the protection region III and the protection ring structure. If the ratio between the total thickness of the isolation structure and the passivation layer and the depth of the trench 240 is too small, the thickness of the isolation structure under the trench 240 may be too small, the isolation structure may crack along the direction perpendicular to the surface of the semiconductor substrate 200. Thus, in one embodiment, the ratio between the total thickness of the isolation structure and the passivation layer and the depth of the trench 240 may be in a range of 9 to 11.

Returning to FIG. 9, after forming the trench, a butter layer may be formed in the trench (S106). FIG. 7 illustrates a corresponding semiconductor structure.

As shown in FIG. 7, a buffer layer 241 may be formed in the trench 240. The mechanical strength of the buffer layer 241 may be greater than the mechanical strength of the isolation structure.

Because the buffer layer 241 may be formed in the trench 240; and the mechanical strength of the buffer layer 241 may be greater than the mechanical strength of the isolation structure, when the isolation structure in the isolation region II and the buffer layer 241 are impacted by an external force, the buffer layer 241 may be not easily damaged. Accordingly, the buffer layer 241 in the seal region III may be protected; and the formation of the crack in the buffer layer 241 in the protection region III may be prevented.

In one embodiment, the buffer layer 241 is made of polymer. Specifically, the buffer layer 241 may be made of an organic photoresist, such as polyimide, etc. In some embodiments, the buffer layer may be made of an organic antireflection material, etc.

The process for forming the buffer layer 241 may include forming a precursor layer in the trench 240; and curing the precursor layer to form the buffer layer 241.

In some embodiments, the buffer layer may be also be formed on the passivation layer.

Various processes may be used to form the precursor layer. In one embodiment, the precursor layer is formed by a spin-coating process.

The buffer layer 241 may be made of polymer; and the precursor for forming the polymer may have a certain degree of fluidity. Thus, the buffer layer 241 may be able to fill the trench 240; and the protection of the buffer layer 241 to the protection region III may be increased. Accordingly, the performance of the semiconductor structure may be improved.

Returning to FIG. 9, after forming the buffer layer, the cutting path structure and the semiconductor substrate may be diced (S107). FIG. 8 illustrates a corresponding semiconductor structure.

As shown in FIG. 8, the cutting path structure and the semiconductor substrate 200 may be diced along the cutting path region I. The semiconductor substrate 200 may be diced into a plurality of individual chips.

The cutting path structure and the semiconductor substrate 200 may be diced by a dicing saw.

During dicing the cutting path structure and the semiconductor substrate 200, the trench 240 may be able to reduce the propagation of the dicing force in the passivation layer. Thus, the formation of cracks in the passivation layer in the protection region III may be prevented.

The present disclosure also provides a semiconductor structure. A corresponding semiconductor structure is illustrated in FIG. 8.

As shown in FIG. 8, the semiconductor structure includes a semiconductor structure 200. The semiconductor substrate 200 may include a plurality of cell regions. Each of the cell regions may include a device region (not shown), a protection region III and an isolation region II. The protection region III may surround the device region, the isolation region II may surround (or enclose) the device region and the protection region III. The semiconductor structure may also include a device structure on the semiconductor substrate 200 in the device region and a protection ring structure on the substrate 200 in the protection region III. The protection ring structure may include a first protection ring 210 and a second protection ring 220. Further, the semiconductor structure may include an isolation structure on the semiconductor substrate 200 in the isolation region II. Further, the semiconductor structure may include a passivation layer on the protection ring structure, the device structure and the isolation structure; and a buffer layer 241 in the surface of the passivation layer. The detailed structures and intermediate structures are described above with respect to the fabrication processes.

The mechanical stress of the buffer layer 421 may be greater than the mechanical stress of the isolation structure. In some embodiments, the semiconductor structure may not include the buffer layer 421, but include a trench at the position of the buffer layer 421. The trench may pass through the passivation layer and extend into the isolation structure. The ratio between the total thickness of the isolation structure and the passivation layer and the depth of the trench 240 may be in a range of approximately 9 to 11.

The isolation structure may be made of silicon oxide, silicon nitride, silicon oxynitride, etc.

The buffer layer 241 may be made of a polymer. In one embodiment, the polymer may be an organic photoresist. In some embodiments, the buffer layer may be made of an organic antireflection layer.

In some embodiments, the buffer layer may also be formed on the passivation layer.

The protection ring structure may include a plurality of protection members layer-stacked with one another. Each protection member may include a protection dielectric layer on the semiconductor substrate 200 in the protection region III; protection plugs in the protection dielectric layer; and a protection metal layer on the protection plugs.

The protection dielectric layer may be made of silicon oxide, or silicon oxynitride, or silicon nitride, etc. The protection plugs and the protection metal layer may be made of Al, or Cu, etc.

The protection ring structure may include the first protection ring 210 and the second protection ring 220. The second protection ring 220 may be between the first protection ring 210 and the isolation region II.

The passivation layer may include a first passivation layer 231 on the first protection ring structure 210, the second protection ring structure 220 and the isolation structure. A top metal layer 230 may be formed in the first passivation layer 231 on the first protection ring 210. The passivation layer may also include a second passivation layer 232 on the first passivation layer and the top metal layer 230.

The first passivation layer 231 and the second passivation layer 232 may be made of silicon oxide, silicon nitride, silicon oxynitride, etc.

The semiconductor substrate 200 may include a plurality of cell regions. Cutting path regions I may be between adjacent cell regions. Cutting path structures may be formed on the semiconductor substrate 200 in the cutting path regions I. Each of the cutting path structures may include a cutting path dielectric layer and a cutting path metal layer in the cutting path dielectric layer.

The cutting path structures may be made of silicon oxide, silicon nitride, or silicon oxynitride, etc.

In the disclosed the semiconductor structure, a trench may be formed in the passivation layer in the isolation region.

When the passivation layer in the isolation region is impacted by an external force, the passivation layer in the isolation region may generate a stress. The trench may be able to isolate the stress, and prevent the stress from transferring into the passivation layer in the isolation region. Accordingly, the effect of the external force to the passivation layer in the protection region may be reduced; and the damage to the passivation layer in the protection region may be reduced. Thus, the trench may be able to prevent the passivation layer from exposing the protection ring structure; and reduce the erosion of the external air to the protection ring structure. Accordingly, the performance of the semiconductor structure may be improved.

Further, a buffer layer may be formed in the trench. The mechanical strength of the buffer layer may be greater than the mechanical strength of the isolation structure. When the isolation structure and the buffer layer are impacted, the buffer layer may not be easily damaged. Thus, the passivation layer in the isolation region may be protected; and the formation of cracks in the passivation layer may be prevented.

Further, the ratio between the total thickness of the isolation structure and the passivation layer and the depth of the trench may be in a range of approximately 9 to 11. Because the ratio between the total thickness of the isolation structure and the passivation layer and the depth of the trench may be smaller than 11, the trench may be able to reduce the damage of the external force to the passivation layer in the protection region. The ratio between the total thickness of the isolation structure and the passivation layer and the depth of the trench may be greater than 9. Thus, the total thickness of the isolation structure under the trench and the passivation layer may be relatively large. The crack in the semiconductor structure at the trench along the direction perpendicular to the surface of the semiconductor substrate may be prevented.

In the disclosed method for forming a semiconductor structure, a trench may be formed in the passivation layer in the isolation region. The trench may pass through the passivation layer. When the passivation layer in the isolation region is impacted by an external force, the trench may be able to prevent the propagation of the force in the passivation layer; and the damage to the passivation layer may be prevented. Thus, the trench may be able to prevent the passivation layer from exposing the protection ring structure; and the performance of the semiconductor structure may be improved.

Further, after forming the trench, the semiconductor substrate and the cutting path structure may be diced along the cutting path region. During dicing the cutting path region and the semiconductor substrate, the trench may be able to prevent the propagation of the dicing force in the passivation layer. Thus, the crack in the passivation layer in the isolation region may be prevented.

Further, the buffer layer may be made of a polymer, the precursor of the polymer may have a certain degree of fluidity, and may be able to fill the trench. Thus, the protection of the buffer layer to the passivation layer in the protection region may be increased; and the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a semiconductor substrate having a plurality of cell regions, wherein each of the cell regions includes a device region, a protection region surrounding the device region and an isolation region surrounding the device region and the protection region;
   a device structure on the semiconductor substrate in the device region;
   a protection ring structure on the semiconductor substrate in the protection region;
   an isolation structure on the semiconductor substrate in the isolation region;
   a passivation layer on the protection ring structure, the device structure and the isolation structure, wherein the passivation layer is on and the isolation region, and the passivation layer partially covers a top surface of the protection region;
   a trench passing through the passivation layer in the isolation region; and
   a buffer layer in the trench and with a mechanical strength greater than a mechanical strength of the isolation structure, wherein the buffer layer passes through the passivation layer in the isolation region and the passivation layer completely covers a top surface of the isolation region except a portion of the top surface of the isolation region in the trench being covered by the buffer layer.

2. The semiconductor structure according to claim 1, wherein:
   the isolation structure is made of one of silicon oxide, silicon nitride and the silicon oxynitride.

3. The semiconductor structure according to claim 2, wherein:
   the buffer layer is made of a polymer.

4. The semiconductor structure according to claim 3, wherein:
   the polymer includes one of photoresist and an organic antireflection material.

5. The semiconductor structure according to claim 1, wherein: the buffer layer is further on the passivation layer.

6. The semiconductor structure according to claim 1, wherein the protection ring structure comprises:
   a plurality of protection members layer-stacked with one another,
   wherein each protection member comprises a protection dielectric layer on the semiconductor substrate in the protection region, protection plugs in the protection dielectric layer and a protection metal layer on the protection plugs.

7. The semiconductor structure according to claim 6, wherein:
   the protection dielectric layer is made of one of silicon oxide, silicon nitride and silicon oxynitride; and
   each of the protection plugs and the protection metal layer is made of one of copper and aluminum.

8. The semiconductor structure according to claim 1, wherein the protection ring structure comprises:
   a first protection ring; and
   a second protection ring,
   wherein:
   the second protection ring is between the first protection ring and the isolation structure;

the first protection ring includes a first plurality of protection members layer-stacked with one another;

the second protection ring includes a second plurality of protection members layer-stacked with one another; and the passivation layer comprises a first passivation layer and a second passivation layer;

a top metal layer is formed on the first protection ring and covering a portion of top surface of the first protection ring, wherein the top metal layer includes a first portion covering the portion of the top surface of the first protection ring, and a second portion on the first portion and covering a portion of the top surface of the first passivation layer;

the second passivation layer is formed on a remaining portion of the top surface of the first protection ring and a top surface of the first passivation layer.

9. The semiconductor structure according to claim 8, wherein:

the first passivation layer is made of one of silicon nitride, silicon oxide and silicon oxynitride;

the second passivation layer is made of one of silicon nitride, silicon oxide and silicon oxynitride; and the top metal layer is made of aluminum.

10. The semiconductor structure according to claim 1, wherein the semiconductor substrate comprises:

a cutting path region between adjacent cell regions, and a cutting path structure formed on the cutting path region, wherein:

the cutting path structure includes a cutting path dielectric layer on the semiconductor substrate and a cutting path metal layer in the cutting path dielectric layer.

11. The semiconductor structure according to claim 10, wherein:

the cutting path dielectric layer is made of silicon oxide, silicon nitride and silicon oxynitride.

12. The semiconductor structure according to claim 1, wherein:

the trench passes through the passivation layer and extends into the isolation structure.

13. The semiconductor structure according to claim 12, wherein:

a ratio between a total thickness of the isolation structure and the passivation layer and a depth of the trench is in a range of approximately 9 to 11.

14. The semiconductor structure according to claim 8, wherein:

the top metal layer is formed directly on the first protection ring, and the first passivation layer is formed directly on the second protection ring and the isolation structure.

15. The semiconductor structure according to claim 8, wherein:

the top metal layer isolates the first protection ring from the second passivation layer, and a portion of the top metal layer is directly sandwiched by the first passivation layer and the second passivation layer.

16. The semiconductor structure according to claim 8, wherein:

the first protection ring comprises:

a plurality of first protection members layer-stacked with one another, wherein each first protection member comprises a first protection dielectric layer on the semiconductor substrate in the protection region, first protection plugs in the first protection dielectric layer and a first protection metal layer on the first protection plugs.

17. The semiconductor structure according to claim 16, wherein:

the second protection ring comprises:

a plurality of second protection members layer-stacked with one another, wherein each second protection member comprises a second protection dielectric layer on the semiconductor substrate in the protection region, a second protection plug in the second protection dielectric layer and a second protection metal layer on the second protection plugs, wherein the first protection metal layer is isolated from a corresponding second protection metal layer in a same protection member layer.

18. The semiconductor structure according to claim 8, wherein:

the passivation layer is formed directly on the second protection ring and the isolation structure.

* * * * *